United States Patent [19]
Savas

[11] Patent Number: 5,534,231
[45] Date of Patent: Jul. 9, 1996

[54] LOW FREQUENCY INDUCTIVE RF PLASMA REACTOR

[75] Inventor: Stephen E. Savas, Newark, Calif.

[73] Assignee: Mattson Technology, Inc., Fremont, Calif.

[21] Appl. No.: 374,404

[22] Filed: Jan. 17, 1995

Related U.S. Application Data

[63] Continuation of Ser. No. 460,707, Jan. 4, 1990.

[51] Int. Cl.$^6$ ........................................ B01J 8/00
[52] U.S. Cl. ............... 216/67; 422/186.01; 204/157.44; 204/298.31; 204/298.34; 156/345; 156/643.1
[58] Field of Search ................... 422/186, 186.01; 204/157.44, 298.31, 298.34; 156/643, 646

[56] References Cited

U.S. PATENT DOCUMENTS

| | | | |
|---|---|---|---|
| 3,715,625 | 2/1973 | Ehlers | 317/4 |
| 4,132,613 | 1/1979 | Penfold et al. | 204/192.12 |
| 4,252,608 | 2/1981 | Baldwin et al. | 176/3 |
| 4,358,686 | 11/1982 | Kinoshita | 250/492.2 |
| 4,362,632 | 12/1982 | Jacob | 422/183.04 |
| 4,431,898 | 2/1984 | Reinberg et al. | 219/121 |
| 4,450,787 | 5/1984 | Weakliem et al. | 427/39 |
| 4,739,169 | 4/1988 | Kurosawa et al. | 250/423 |
| 4,844,775 | 7/1989 | Keeble | 204/192.32 |
| 4,918,031 | 4/1990 | Flamm et al. | 437/225 |
| 5,234,529 | 8/1993 | Johnson | 156/345 |
| 5,304,282 | 4/1994 | Flamm | 156/643 |

FOREIGN PATENT DOCUMENTS

| | | | |
|---|---|---|---|
| 2531812B2 | 2/1976 | Germany | H05H 1/24 |
| 3102174A1 | 12/1981 | Germany | H05H 1/46 |
| 59-84528 | 5/1984 | Japan . | |
| 2170966 | 8/1986 | United Kingdom | H05H 1/24 |

OTHER PUBLICATIONS

Cicala et al., "Effect of Modulation on the Plasma Deposition of Hydrogenated and Fluorinated Silicon Nitride," Plasma–surface Interactions and Processing of Materials, pp. 171–173, NATO ASI Series E: Applied Sciences, vol. 176, Kluwer Academic Publishers, the Netherlands, 1990, edited by O. Auciello et al.

Cook et al., "Energy Anomalies Observed in Ion Beams Produced by rf Sources," The Review of Scientific Instruments, vol. 33, No. 6, Jun. 1962, pp. 649–652.

Williams, "Extraction of Positive Ions from Electrodeless Discharge," The Review of Scientific Instruments, vol. 37, No. 9, Sep. 1966, pp. 1205–1210.

Letts, S. L. et al., "Laser Program Annual Report–1978, " vol. 1, Lawrence Livermore Report UCRL–50021–78, pp. 4–7 to 4–11, edited by M. J. Monsler and B. D. Jarman.

Letts, S. L. et al., "Laser Program Annual Report–1979," vol. 2, Lawrence Livermore Report UCRL–50021–79, edited by L. W. Coleman and J. R. Strack, Mar. 1980.

B1–B5 Photocopies of sections of Lawrence Livermore Laboratory Drawing No. AAA–78–107861–00 drawn by R. Dowrick.

Two drawings labeled "Helical Resonator Plasma Coater".

(List continued on next page.)

Primary Examiner—J. Woodrow Eldred
Attorney, Agent, or Firm—Wilson, Sonsini, Goodrich & Rosati

[57] ABSTRACT

A plasma reactor with rf power inductively coupled into the reactor chamber to produce an rf magnetic field substantially perpendicular to a pedestal on which a wafer is placed for processing. Said pedestal is a powered electrode to which power is coupled to control the sheath voltage of the pedestal. This reactor is particularly suitable for soft etches and processes in which it is advantageous to couple much more power into ion production than into free radical production.

114 Claims, 3 Drawing Sheets

OTHER PUBLICATIONS

Johnson et al., "Plasma Polymerization Coating of DT-Filled Glass Shells for Laser Fusion Targets," Laser Fusion Targets, pp. 315–330, 1979 American Chemical Society.

Letter from D. L Flamm to B. S. Schneider dated Jul. 8, 1989.

Letter from August Manza to B. S. Schneider dated Sep. 12, 1989.

Letter from D. L. Flamm to A. Manza dated Jun. 18, 1990.

Information Disclosure Statement, Jul. 13, 1991, in application serial no. 07/686,763, issued as U.S. Patent No. 5,304,282.

"Plasma Physics—Study of the electron temperature and density of an inductive HF discharge in hydrogen, using the symmetrical double-probe method" —report by Mr. Guy Turban, as presented by Mr. Louis Nèel. C. R. Acad. Sc. Paris, vol. 273 (Sep. 27, 1971), Series B, pp. 533–536. Both the French article and English translation of the text are included.

"Plasma Physics—Measurement of the energy-distribution function of electrons in an inductive HF discharge in hydrogen, using the asymmetric triple-probe method" —report by Mr. Guy Turban, as presented by Mr. Louis Nèel. C. R. Acad. Sc, Paris, vol. 273 (Oct. 4, 1971), Series B, pp. 584–587. Both the French article and English translation of the text are included.

"The Hundred Year History Of Induction Discharges", Hans U. Eckert, Proceedings 2nd Annual International Conference on Plasma Chemistry and Technology, Herman Boenig, Ed., Techromic Publ., Lancaster, PA, 1986, pp. 171–201.

"ICRH Antenna Design And Coupling Optimization Studies", R. R. Weynants et al., Proceedings of 2nd Joint Grenoble–Vienna International Symposium, vol. 1 (Como, Italy) 1980.

John A. Thornton, "Plasma–Assisted Deposition Processes: Theory, Mechanisms and Applications", *Thin Solid Films*, vol. 107, 1983, pp. 3–19.

B. A. Probyn, "Sputtering of Insulators in an RF Discharge", *Vacuum*, vol. 18, No. 5, 1968, pp. 253–257.

Daniel L. Flamm, et al., "The Design of Plasma Etchants", *Plasma Chemistry and Plasma Processing*, vol. 1, No. 4, 1981, pp. 317–363.

J. W. Coburn, "Summary Abstract: Ion–Enhanced Gas–Surface Chemistry", *J. Vac. Sci. Technol.*, vol. 21, No. 2, Jul./Aug. 1982, pp. 557–558.

Josef Freisinger and Horst W. Loeb, "The Neutral Particles Injectors Rig For Fusion Reactors", Atomkernenergie–Kerntechnik, vol. 44 (1984) No. I, pp. 81–86.

J. Coburn and e. Kay, "Positive–Ion Bombardment Of Substrates In RF Diode Glow Discharge Sputtering", J. Appl. Phys., 43. p. 4965 (1972).

J. Freisinger et al entitled "RF–Ion Source Rim 10 For Material Processing With Reactive Gases". IX International Conference on Gas Discharges And Their Applications, pp. 19–23 Sep. 1988.

J. L. Vossen, entitled "Glow Discharge Phenomena In Plasma Etching And Plasma Deposition", J. Electrochem. Soc. Solid–State Science and Technology, vol. 126, No. 2, Feb. 1979, p. 319.

LOW FREQUENCY INDUCTIVE RF PLASMA REACTOR

This application is a continuation of application Ser. No. 07/460,707, filed Jan. 4, 1990.

In the figures, the first digit of a reference numeral indicates the first figure in which is presented the element indicated by that reference numeral.

BACKGROUND OF THE INVENTION

This invention relates in general to a wafer processing system and relates more particularly to a wafer processing plasma reactor in which the plasma is generated primarily by inductively coupled power.

Plasma etching or deposition in the fabrication of circuits is attractive because it can be anisotropic, can be chemically selective and can produce processing under conditions far from thermodynamic equilibrium. Anisotropic processing enables the production of integrated circuit features having sidewalls that extend substantially vertically from the edges of a the masking layer. This is important in present and future ULSI devices in which the depth of etch and feature size and spacing are all comparable.

In FIG. 1 is shown a typical wafer processing plasma reactor 10. This reactor includes a dielectric coated metal wall 11 that encloses a plasma reactor chamber 12. Wall 11 is grounded and functions as one of the plasma electrodes. Gases are supplied to chamber 12 from a gas source 13 and are exhausted by an exhaust system 14 that actively pumps gases out of the reactor to maintain a low pressure suitable for a plasma process. An rf power supply 15 connected to a second (powered) electrode 16 capacitively couples power into a plasma in chamber 12. A wafer 17 is positioned on or near powered electrode 16 for processing. Wafers 17 are transferred into and out of reactor chamber 12 through a port such as slit valve 18.

RF power at 13.56 MHz is predominantly utilized in plasma reactors because this frequency is an ISM (Industry, Scientific, Medical) standard frequency for which the government mandated radiation limits are less stringent than at non-ISM frequencies, particularly those within the communication bands. This substantially universal use of 13.56 MHz is further encouraged by the large amount of equipment available at that frequency because of this ISM standard. Other ISM standard frequencies are at 27.12 and 40.68 MHz, which are first and second order harmonics of the 13.56 MHz ISM standard frequency.

A plasma consists of two qualitatively different regions: a quasineutral, equipotential conductive plasma body 19 and a boundary layer 110 called the plasma sheath. The plasma body consists of substantially equal densities of negative and positive charged particles as well as radicals and stable neutral particles. RF power coupled into the reactor chamber couples energy into the free electrons, imparting sufficient energy to many of these electrons that ions can be produced through collisions of these electrons with gas molecules. The plasma sheath is an electron deficient, poorly conductive region in which the gradient in the space potential (i.e., the electric field strength) is large. The plasma sheath forms between the plasma body and any interface such as the walls and electrodes of the plasma reactor chamber.

When the powered electrode is capacitively coupled to the rf power source, a negative dc component $V_{dc}$ of the voltage at this electrode (i.e., the dc bias) results (see, for example, H. S. Butler and G. S. Kino, *Physics of Fluids*, 6, p. 1348 (1963). This bias is a consequence of the unequal electron and ion mobilities and the inequality of the sheath capacitances at the electrode and wall surfaces. The magnitudes of the sheath capacitances are a function of the plasma density as well as the chamber geometry and the relative areas of the electrode and wall within the plasma chamber. Sheath voltages at the powered electrode on the order of several hundreds of volts are commonly produced (see, for example, J. Coburn and E. Kay, *Positive-ion bombardment of substrates in rf diode glow discharge sputtering*, J. Appl. Phys., 43, p. 4965 (1972).

The dc component of the sheath potential at the powered electrode is useful in accelerating ions to higher energy in a direction substantially perpendicular to the powered electrode. Therefore, in a plasma etching process, a wafer 17 to be etched is positioned on or slightly above the powered electrode 16 so that this flux of positive ions is incident substantially perpendicular to the plane of the wafer, thereby producing substantially vertical etching of unprotected regions of the wafer. These high sheath voltages (and high discharge voltage) are needed in some processes (like $SiO_2$ etching) to produce etch rates that are required for a commercial etch process.

Transistor speed specifications and high device densities in the most modern MOS integrated circuits have required the use of shallow junctions and thin (on the order of 100 Å) gate oxides under polysilicon gates that are thousands of Angstroms thick. Unfortunately, such IC structures are sensitive to ion bombardment by high energy (>100 ev) ions such as in the conventional plasma etch apparatus of FIG. 1 so that, during the step of etching the polysilicon layer to form the gate, it is difficult to avoid damaging the gate oxide. Because wafer damage decreases with decreasing ion energy and associated sheath voltage, it would be advantageous to operate at smaller discharge power levels and voltages. Unfortunately, for capacitively coupled power at 13.56 MHz, this reduction of voltage results in a proportionately slower etch rate for many processes, which thereby significantly degrades process throughput.

Etch rates for $SiO_2$ and some Si etch processes are a function of the ion bombardment power density transmitted from the plasma to the wafer. Since this power is equal to the product of the sheath voltage at the powered electrode and the ion current density at the wafer, the ion current density at the wafer must be increased to maintain substantially constant etch rate with decreased sheath voltage. This requires that the plasma ion density near the wafer be increased. Unfortunately, in a conventional plasma etcher, both the sheath voltage of the powered electrode and the ion density near that electrode are proportional to each other and are monotonically increasing functions of the amplitude of the rf voltage applied to the powered electrode. Thus, if the sheath voltage is decreased by decreasing the voltage of the rf signal, then the current density of the ion beam at the wafer also decreases thereby producing an even greater percentage decrease in etch rate than in either the sheath voltage or the ion current. It would therefore be advantageous to be able to control independently the sheath voltage and ion density at the wafer so that a soft etch process (i.e., an etch process with reduced sheath voltage at the wafer) can be implemented that has a commercially adequate etch rate.

One method of increasing etch rate by enhancing plasma ion density near the wafer utilizes magnets to produce a magnetic containment field that traps electrons within the vicinity of the wafer, thereby increasing the ion production rate and associated density at the wafer. The magnetic containment field confines energetic electrons by forcing them to spiral along helical orbits about the magnetic field lines. Unfortunately, nonuniformities of the magnetic containment field of such "magnetically enhanced" plasma etching systems decrease etch rate uniformity over the surface of the wafer. The $\vec{E} \times \vec{B}$ drifts due to the electric field in and near the sheath also reduces etch rate uniformity in such systems. To improve uniformity over the surface of the wafer in one such system, the wafer is rotated about an axis that is perpendicular to and centered over the surface of the powered electrode. This produces at the wafer surface a cylindrically symmetric time-averaged field that has improved average uniformity over the wafer, thereby producing increased etch uniformity. However, this rotation produces within the plasma chamber undesirable mechanical motion that can produce particulates and increase contamination.

Another technology that has potential for producing acceptable etch rates at low ion bombardment energy is the recently developed technique of electron cyclotron resonance plasma production. This technique has application to wafer cleaning, etching and deposition processes. In this technique, a plasma is produced by use of a microwave source and a magnetic containment structure. Unfortunately, this technique, when applied to etching or chemical vapor deposition, exhibits high levels of particulate formation, poor radial etch rate uniformity and low throughput. The fraction of energy coupled into production of radicals increases very rapidly above about 1 milliTorr so that the pressure in this system must be kept below this level. This requires expensive hardware that includes: (1) a very large pumping speed (>3,000 liters per second, which is 10 times typical values) vacuum pumping system to produce the very low (0.1–1 milliTorr) pressures required for this process; and (2) a large magnetic containment system that sometimes includes large electromagnets.

Another technique for increasing the ion density utilizes a microwave plasma generator to generate ions in a region at least 10 cm above the wafer. These ions flow into the volume above the wafer and therefore contribute to the ion density at the wafer. However, this approach tends to produce copious amounts of free radicals and produces no more than a few milliamps/cm$^2$ ion current density at the wafer.

SUMMARY OF THE INVENTION

In accordance with the illustrated preferred embodiment, a plasma reactor is presented in which low frequency (0.1–6 MHz) rf power is inductively coupled into the plasma to provide energy for ionization of the gas near a wafer-holding, powered electrode and a high frequency voltage of lower power is applied to the powered electrode to control the ion bombardment energy of a wafer upon this electrode. A wafer is placed on or just above this powered electrode for processing.

This plasma reactor has a nonconductive chamber wall that is encircled by an induction coil that is connected to a low frequency rf source. A split Faraday shield is positioned between the induction coil and the sidewall of the reactor and encircles the reactor to substantially eliminate the production of displacement currents between the induction coil and the plasma reactor. This shield, in effect, greatly reduces the capacitive coupling of the low frequency rf electric field to the plasma (See, the article by J. L. Vossen, entitled *Glow Discharge Phenomena in Plasma Etching and Plasma Deposition*, J. Electrochem. Soc. Solid-State Science and Technology, Vol. 126, No. 2, February 1979, page 319) so that the energy of ion bombardment of the reactor wall and associated etching and sputtering of the reactor wall is substantially eliminated and so that the modulation of the wafer sheath voltage at the low frequency is reduced.

This Faraday shield is movable so that the capacitance between the plasma and the shield can be varied. The Faraday shield is placed substantially in contact with the chamber outer wall, producing a high value of capacitance during wafer processing. This reduces the rf plasma potential, thereby reducing plasma etching of the walls of the reactor. An increased gap between the Faraday shield and the chamber wall yielding a reduced value of capacitance can be used outside of periods of wafer etching to produce increased rf and time-averaged plasma potential levels, thereby causing higher energies of ion bombardment that enable cleaning of the reactor walls with a controlled level of etching. Preferably, the Faraday shield is moved radially to alter capacitance, but the capacitance could also be varied by vertical movement of the Faraday shield. In an embodiment in which the shield is movable vertically, the shield should not be allowed to move far enough vertically that it does not lie between the reactor chamber and every coil of the induction coil. A conductive sheet can be included above the top of the chamber to increase the capacitance of the plasma to the effective rf ground electrode provided by the reactor wall. This plate can also be movable to vary the capacitance between the plasma body and this portion of the Faraday shield.

A dc magnetic field can be included to enhance ion generation at low pressures by confining electrons away from the walls of the chamber. At low pressure, electrons have an increased mean free path that would increase their rate of loss from the chamber by collisions with the chamber wall. This magnetic field forces the electrons into helical paths that have an increased chance of making ionizing collisions within the chamber before colliding with a wall.

A diverging magnetic field which is stronger near the top of the reactor chamber can be included to reflect electrons back into the plasma, thereby preventing their loss at the top wall of the chamber. This latter magnetic field (which might be as small as several Gauss near the top of the chamber) can be produced either by an array of permanent magnets positioned on top of the chamber and having alternating directions of their magnetic fields, by a solenoidal coil carrying dc current or by a ferromagnetic disk.

The inductively coupled rf power is supplied at a frequency in the range 0.1–6 MHz and at a power level up to 10 kW, depending on the size of the reactor chamber. The voltage applied to the powered electrode is at a frequency much higher than the inverse of the average time for an ion to cross the sheath at the powered electrode. Preferred choices for the frequency $f_h$ of this voltage signal are any of the ISM standard frequencies 13.56, 27.12 and 40.68 MHz. The higher frequencies will be needed for higher densities of plasma in order to produce ion bombardment energies which are not too broadly distributed.

The sheath at the powered electrode contains a strong electric field that is substantially perpendicular to the plane of the wafer, thereby producing substantially vertical ion impact and associated substantially vertical or controlled taper etching of the wafer. The amount of capacitively coupled power provided to the powered electrode is substantially less than the power provided inductively to the plasma. Therefore, the average ion current at the wafer is primarily determined by the inductively coupled power and, due to the Faraday shield, the average ion energy at the wafer is substantially a function only of the amplitude of the rf signal to the powered electrode. In contrast to this, in the typical plasma reactor illustrated in FIG. 1, both the average ion density (which is typically somewhat lower) and energy are controlled by the amplitude of the rf signal to the powered electrode. The inductively coupled reactor therefore enables the sheath voltage to be reduced and the ion density to be increased. Also, the sheath voltage and ion density can be separately varied. Consequently, a soft etch at a commercially acceptable etch rate can be achieved that does not damage the recent type of integrated circuits that can be damaged by ions of impact energy of order or greater than 100 electron volts.

The electromagnetic fields in the inductively coupled plasma reactor can produce a plasma ion density distribution that is very uniform over the wafer and therefore produces very uniform wafer processing. The inductively generated electric field is substantially circumferential and therefore accelerates electrons substantially parallel to the side wall of the reactor. Because of the conductivity of the plasma, the strength of this electric field decreases rapidly away from the side wall so that electron acceleration occurs primarily in a region near the side wall. As an electron gains speed, its inertia produces a trajectory that may include a succession of elastic collisions with molecules and/or glancing collisions with the sheath at the side wall. Such collisions can kick the electron into the plasma body. This results in significant electron acceleration only near the wall, but also results in ion generation throughout the chamber. The diffusion of these electrons and ions and the radial $\vec{E} \times \vec{B}$ drift of electrons produces near the wafer a radially symmetric ion density that has a very uniform density. A low pressure (typically, on the order of 1–30 milliTorr) is maintained in the reactor chamber to facilitate diffusion of the electrons away from the region where they gain energy near the side wall.

This design is also extremely efficient in coupling power into the production of ions and therefore provides an important advantage over other reactors for wafer processing that is to be performed by the ions in the plasma (see, for example, the article by J. Freisinger et al entitled *RF-ion source RIM* 10 for material processing with reactive gases, IX International Conference on Gas Discharges and their Applications, 19–23 Sep. 1988). The importance of this can be seen from the following. RF power to a plasma produces neutral radicals, ions, free electrons and excitation of molecules and atoms by the free electrons. The vertical etching that is produced by reactive ions is favored in a chamber that channels a high fraction of the rf power into ion production. For excess radical concentrations, the reaction on the wafer surface by the radicals can be detrimental to the desired fabrication process so that it is also advantageous in many applications to reduce the relative production of free radicals by the plasma. Therefore, this plasma reactor is particularly suitable for reactive ion etch processes and other processes that are either favored by high ion concentration or degraded by significant free radical concentration. This reactor also requires much less capacitively coupled power than conventional plasma reactors. This system utilizes on the order of a few hundred Watts of rf power to the powered electrode compared to 500–1000 Watts for a conventional plasma reactor in which all power is coupled capacitively. This system also provides the ability to control independently the ion current and the ion impact energy.

DESCRIPTION OF THE PREFERRED EMBODIMENT

Figure 1:
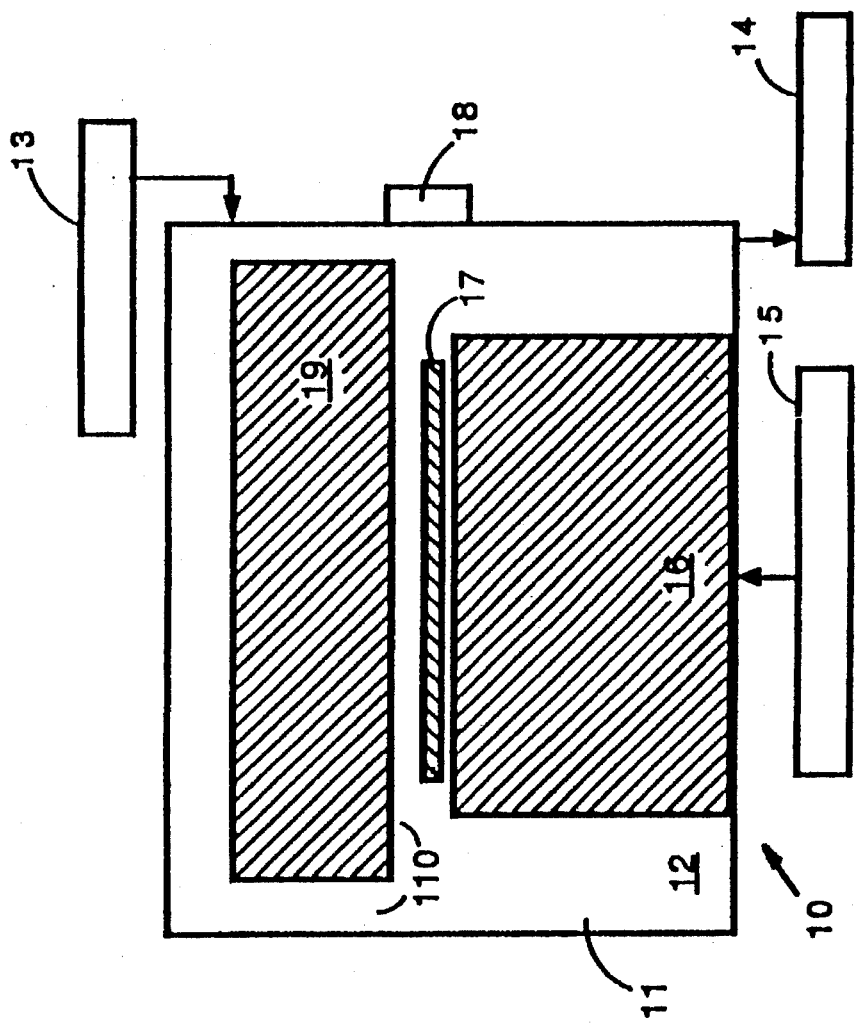
FIG. 1 illustrates the structure of a typical plasma reactor.

In the conventional plasma reactor of FIG. 1, the amplitude of the rf signal applied to powered electrode 16 controls not only the ion density in the plasma, but also the sheath voltage of the powered electrode. To achieve a soft etch (i.e., energy of ion bombardment of the wafer on the order of 100 volts or less) the capacitively applied rf power should be reduced below that conventionally used in such a reactor. Unfortunately, this reduction of capacitively applied power would not only reduce the voltage drop across this sheath, it would also reduce the ion density at this sheath. Even at high rf voltage to the powered electrode, such capacitively coupled power produces only a relatively low density of ions. Because the wafer etch rate is proportional to the product of the ion density at this sheath times the voltage drop across this sheath, the wafer etch rate decreases faster than either of these two parameters. Thus, a soft etch produces a reduction in throughput that is incompatible with a commercial integrated circuit fabrication process.

Figure 2:
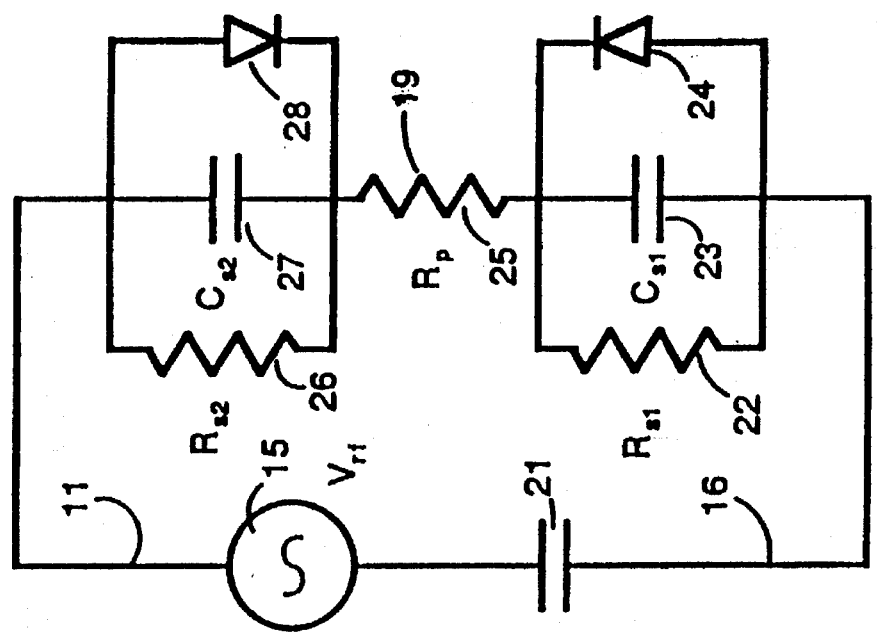
FIG. 2 is an equivalent circuit for a plasma reactor in which power is capacitively coupled into the reactor chamber.
Figure 3:
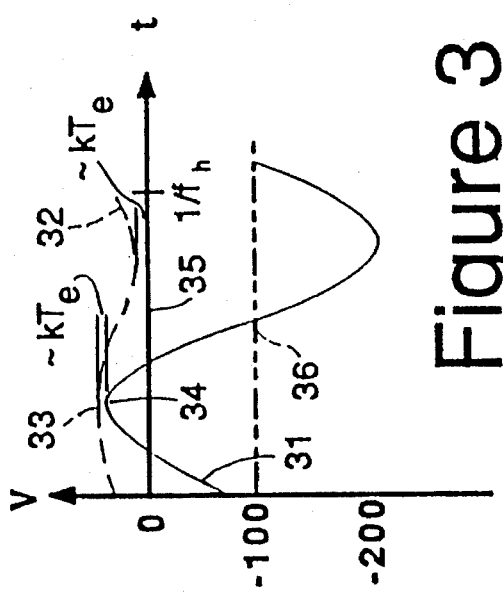
FIG. 3 illustrates the relationship between the rf signal applied to the powered electrode, the voltage $V_p$ of the plasma and the sheath voltage $V_{dc}$.

That the sheath voltage in this system is tied to the amplitude of the rf signal applied to the powered electrode can be seen by reference to FIGS. 2 and 3. A capacitor 21 between rf source 15 and powered electrode 16 enables this sheath voltage to have a dc component. This dc component is produced by the combined effects of the unequal areas of the electrodes and the unequal mobilities of the electrons and ions. Each plasma sheath is electronically equivalent to the parallel combination of a resistance, a capacitance and a diode. The electric field across the sheath repels most of the electrons out of the sheath region producing a large sheath resistance on the order of $10^4$ ohms. The capacitive component of the sheath impedance as a function of increasing frequency becomes small enough to be significant at about 500 kHz and can be substantially ignored much below that frequency. At frequencies much above 500 kHz, the sheath resistance is large enough that it can be ignored. This is the case for the high frequency sheath voltage component at the frequency of the capacitively coupled power.

In the equivalent circuit in FIG. 2, the effects of the much higher mobility of the electrons than the ions in the plasma and sheath is modeled by diodes 24 and 28. Thus, if the plasma were to become negative with respect to any electrode adjacent to the plasma, the electrons in the plasma would see an effective short to that electrode. The sheath impedances are therefore modeled by elements 22–24 and 26–28. The plasma body can be modeled as a low impedance resistance 25 that can be ignored at the high frequency $f_h$ (preferably one of the ISM frequencies 13.56 MHz, 27.12 MHz or 40.68 MHz) utilized for the rf voltage applied to the powered electrode.

FIG. 3 illustrates the relationship between a 220 volt peak-to-peak rf signal 31 of frequency $f_h$ applied to the powered electrode, the resulting voltage 32 of the plasma and the sheath voltage 36 of the powered electrode. The sheath capacitances $C_{s1}$ and $C_{s2}$ dominate at the frequency $f_h$ of the capacitively coupled power so that resistances $R_{s1}$ and $R_{s2}$ can be ignored and diodes 24 and 28 can be ignored except for a short interval during each period of signal 31. Therefore, under most operating conditions, the plasma equivalent circuit reduces to a capacitive divider so that the plasma potential $V_p$ and the high frequency components of the voltages across capacitances $C_{s1}$ and $C_{s2}$ are substantially in phase and related in magnitude by $V_p = V_{rf} C_{s2}/(C_{s1}+C_{s2})$.

For a typical reactor with a wall area several times that of the powered electrode, the sheath capacitance $C_{s2}$ at the wall is on the order of 10 times the sheath capacitance $C_{s1}$ at the powered electrode. Therefore, for a 220 volt peak-to-peak rf signal 31, the plasma potential $V_p$ is on the order of 20 volts peak-to-peak. Because signals 31 and 32 are in phase, a peak 33 of signal 32 is aligned with a peak 34 of signal 31. Because of diode 24, the minimum voltage difference between signals 31 and 32 (occurring at each peak 34) is on the order of $kT_e/e$. Similarly, $V_p$ must also be at least $kT_e/e$ more positive than ground 35 to avoid shorting the plasma to the walls of the reactor. These various requirements produce an average sheath voltage 36 of the powered electrode (i.e., the dc component of rf signal 31) of approximately −90 volts. The dc component of the sheath voltage is substantially equal to $-V_{rf} C_{s1}/(C_{s1}+C_{s2})/2$ where $V_{rf}$ is the peak-to-peak magnitude of the rf voltage. The sheath voltage varies directly with the magnitude of the rf signal because the electric field component of the rf signal is substantially perpendicular to the powered electrode. This means that the dc component 36 of voltage 31 is directly tied to the peak-to-peak amplitude of the rf voltage applied to the powered electrode.

The ionic current density at the powered electrode of a conventional plasma reactor is proportional to the ion density in the plasma which in turn decreases with decreasing power so that if the rf voltage amplitude is decreased to decrease the sheath voltage, then the current density also decreases. Therefore, the plasma reactor of FIG. 1 does not enable the current density at the wafer to be increased to maintain etch power when the voltage is decreased to produce a softer etch.

The voltage drop across the sheath at the powered electrode is equal to the difference between the applied rf signal 31 and the voltage 32 of the plasma. This voltage drop varies from about 0 volts to about −220 volts. If an ion were to cross this sheath in a time interval that is short compared to the period $1/f_h$ of the rf signal, then its bombardment energy could be almost zero if it crossed the sheath near a peak 34 of rf signal 31. Such low energy bombardment ions would not necessarily have trajectories substantially perpendicular to the plane of the wafer and therefore could degrade the desired vertical etch of the wafer. It is therefore important for the period $1/f_h$ to be no more than half as large as the average time for an ion to cross this sheath. Since this transit time is on the order of or less than a half microsecond, $f_h$ should be at least 4 MHz. For higher ion densities and low sheath voltage, the period $1/f_h$ can be as small as 0.1 μs or less. Because of the less stringent limitations on ISM frequencies, it is preferred that $f_h$ equal one of the ISM frequencies 13.56 MHz, 27.12 MHz and 40.68 MHz.

Figure 4:
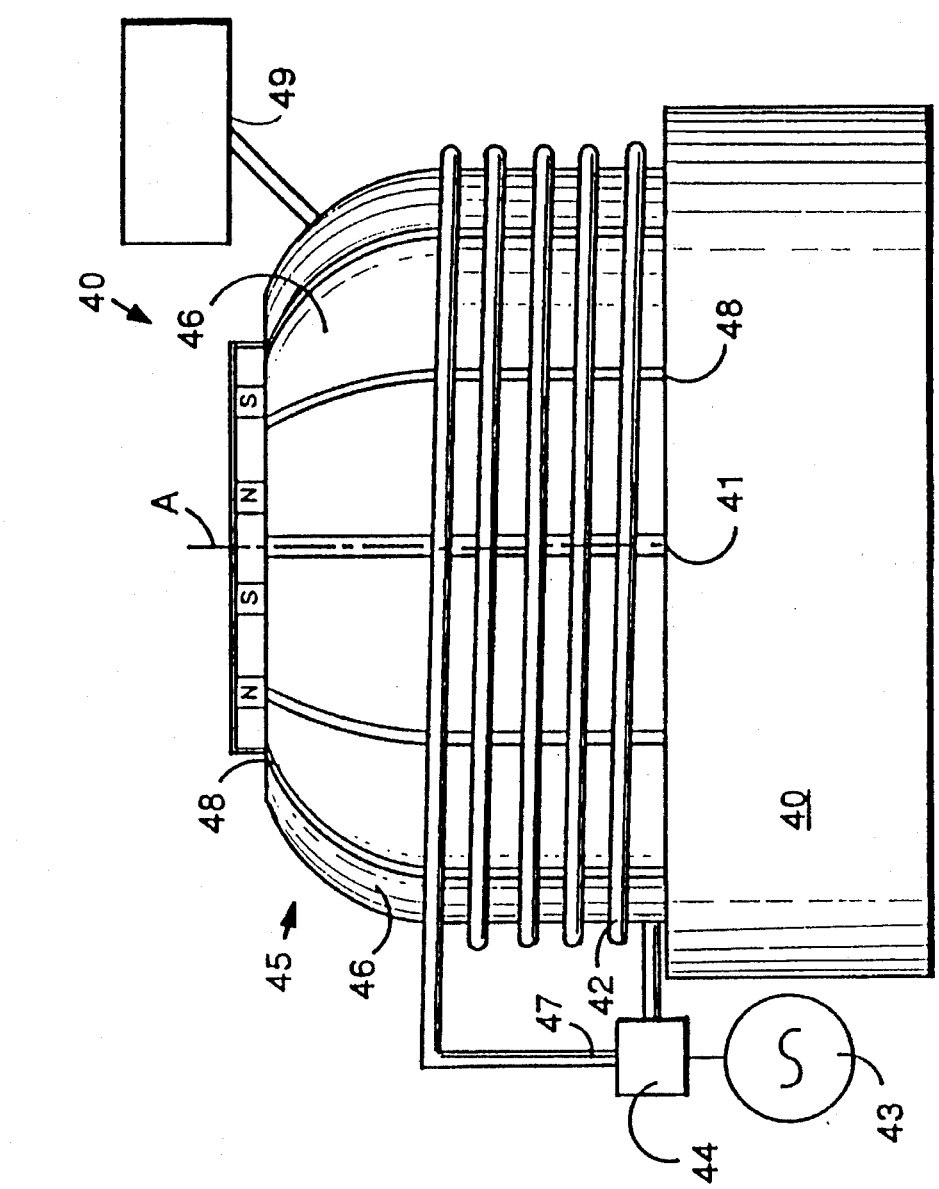
FIG. 4 is a side view of the inductively coupled reactor.

In FIG. 4 is a plasma reactor 40 that allows independent, controllable variation of the sheath voltage and the ion current density at the wafer. This reactor also produces a very uniform distribution of ion current density and voltage at the wafer and can provide an increased ratio between ion and free radical production rates in the plasma relative to purely capacitive or higher frequency inductive discharges. This system is therefore particularly useful for applications in which an increased ratio of ions to free radicals is advantageous.

Figures 5, 6:
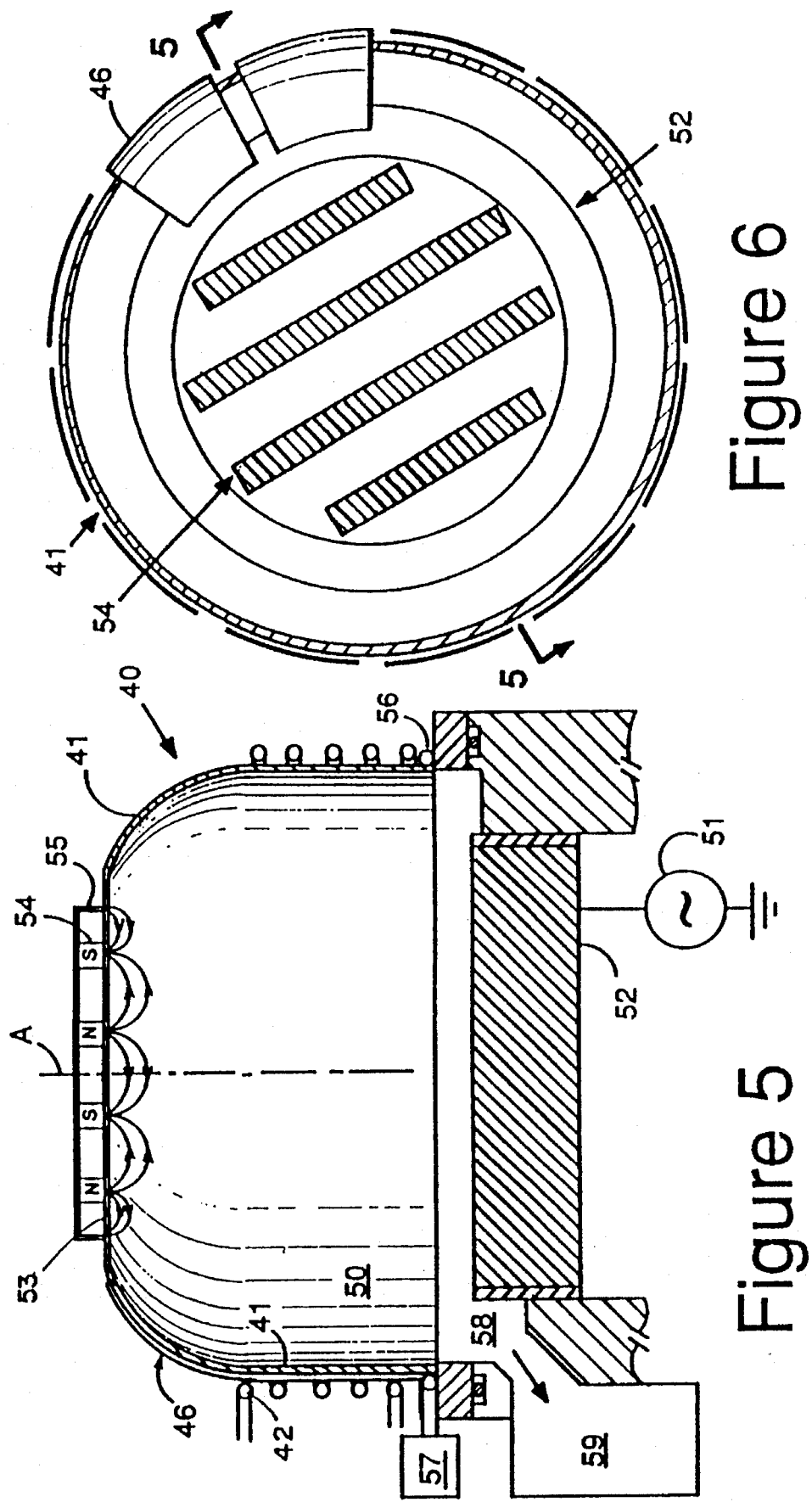
FIG. 5 is a cross-sectional side view of the inductively coupled reactor of FIG. 4.
FIG. 6 is a top view of the reactor of FIG. 4.

On a base 40 is a cylindrical chamber wall 41 that encloses a plasma reactor chamber 50 (shown in FIG. 5). Chamber wall 41 is on the order of 3–12 inches high and has a lateral diameter that is dependent on the diameter of the wafers that are to be processed. For a 6" diameter wafer processing system, this chamber wall has a lateral diameter on the order of 10–12 inches and for a 8" diameter wafer processing system, this chamber has a lateral diameter on the order of 12–15 inches. Chamber wall 41 is made of a nonconductive material such as quartz or alumina.

Encircling wall 41 is an inductive coil 42 that is connected to a first rf source 43 through a conventional impedance match network or transformer 44. This coil has only a few turns (on the order of 2–8 turns) to produce an inductance that can be conveniently matched to rf source 43 by a conventional match network 44 utilizing commercially convenient reactance values or by a transformer to match the inductive impedance (typically, equal to or less than 10 ohms) to the impedance (typically, 50 ohms) of source 43. The match network is designed to substantially eliminate the reflection of power back to source 43. This inductive coil produces within chamber 50 an axially symmetric rf magnetic field whose axis is substantially vertical and an electric field that is substantially circumferential. Both of these fields exhibit a rotational symmetry about a central axis A. This rotational symmetry contributes to the uniformity of wafer processing.

Because of the high conductivity of the plasma, the inductively coupled fields are substantially limited to a region adjacent to the side wall of skin depth δ (on the order of a centimeter) proportional to the square root of the electron density in the plasma divided by the frequency $f_1$ of the inductively coupled rf field. For larger systems, $f_1$ can be reduced to increase the thickness of this region within which electrons are accelerated.

Within this region, the circumferential electric field accelerates the electrons circumferentially. However, because of the inertia of these accelerated electrons, they may experience glancing collisions with the electric field of the sheath at the sidewall. Such collisions will reflect most of these electrons away from the wall. Some of these electrons will strike the side wall and may produce secondary electrons. Elastic collisions with gas molecules cause the electrons to diffuse throughout the volume of the chamber. Because the inductively generated electric field is limited to the distance δ (the resistive skin depth) from the side wall, electron heating is limited to this region. In order to enhance the uniformity of ion density across the wafer, the pressure is kept low (typically 1–30 milliTorr) so that the electrons heated near the wall can rapidly diffuse away from the wall to produce a very uniform ionization and resulting ion density across the wafer surface.

The reactor radius R, the frequency $f_1$ and the power of the inductively coupled power are selected to produce a circumferential electric field having a peak-to-peak amplitude on the order of 1–10 volts/cm. This results in an oscillatory electron path of amplitude on the order of or greater than 3 cm so that the mean free path of these electrons is on the order of or less than the amplitude of their oscillatory motion. Source 43 provides power at a frequency in the range 0.1–6 MHz and at a power of up to 10 kW.

A second rf source 51 (shown in FIG. 5) provides rf power to a powered electrode 52, preferably at one of the ISM (Industry, Scientific, Medical) standard frequencies (i.e., 13.56 MHz, 27.12 MHz or 40.68 MHz). As in the embodiment of FIG. 1, this rf power produces a dc sheath voltage next to the powered electrode 52. The power level is in the range from less than 100 Watts to a few (up to 5) hundred Watts so that the effect of this capacitively coupled rf signal on the ion density is much less than the effect of the power inductively coupled from source 43. This power level is somewhat less than that typically provided to the powered electrode in a plasma reactor. This power level can be kept low to produce a soft (i.e., kinetic energy less than 100 ev) bombardment of the wafer by ions. This low power level to the powered electrode also means that the ion density is determined primarily by rf source 43. This is advantageous in decoupling control of the ion density and the sheath voltage.

The circumferential direction of the inductively generated electric field makes this field parallel to the powered electrode so that a path integral from the plasma body to the powered electrode along a normal to the powered electrode is zero. As a result of this, unlike in the plasma reactor of FIG. 1, there is no rf component across the sheath producing an rf time varying potential difference between the plasma body and the powered electrode. This substantially eliminates coupling of the low frequency induced rf field to the potential of the powered electrode. Therefore, the sheath voltage of powered electrode 52 is determined only by rf source 51.

Enclosing the side wall of the reactor is a grounded Faraday shield 45 consisting in this embodiment of a dozen conductive plates 46 that conform to the side wall. Each Faraday shield conductive plate 46 is spaced from its neighboring plates by gaps 48. These gaps are needed to enable the induction rf magnetic field to penetrate within reactor chamber 50. At least one gap is needed to prevent the formation of a circumferential current in the Faraday shield. By Lenz's Law, such a circumferential current would strongly oppose variation of magnetic field within reactor chamber 50, thereby substantially countering the desired action on reactor chamber 50 of the current in coils 42.

This Faraday shield also provides the same functions as the grounded conductive walls of the reactor of FIG. 1—namely, it confines the capacitively coupled rf fields to the reactor chamber 50 so that they do not stray outside of the chamber and interfere with other equipment or violate federal radiation standards. This shield also provides a return path for the high frequency current from the electrode produced by capacitively coupled power supply 51.

Faraday shield 45 can, when positioned next to the reactor wall, significantly reduce the amount of time variation of the plasma potential $V_p$ at the rf frequency $f_1$ of source 43. This is important in decoupling the effects of the first rf source 43 and the second rf source 51 on the ion density and the average sheath voltage $V_{dc}$. At the power levels applied to coils 42, the large inductance (on the order of 1–100 microHenrys) of these coils produces a large voltage at one or both ends of these coils. If the Faraday shield were absent, then the high voltage end 47 of coil 42 would couple capacitively to the plasma body and impress an rf variation of $V_p$ at the frequency $f_1$ of source 43 (see, for example, J. L. Vossen, *Glow Discharge Phenomena in Plasma Etching and Plasma Deposition,* J. Electrochem. Soc.: Solid-State Science And Technology, Vol. 126, No. 2, p. 319).

The widths of gaps 48 are less than the minimum spacing between these plates 46 and coils 42 so that coils 42 do not significantly couple capacitively through these gaps to the plasma body (see the Vossen reference). If such capacitive coupling to the plasma body were not blocked, this rf variation of $V_p$ would show up as a variation of the sheath voltages (and hence, ion energy) at this same frequency. Furthermore, this electric field could degrade the symmetry of the etch if it were not substantially excluded by the Faraday shield.

Figure 7:
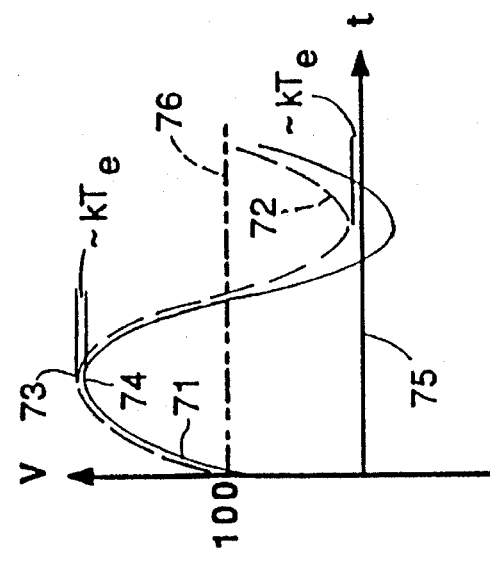
FIG. 7 illustrates the relationship of the plasma voltage $V_p$ and the rf voltage applied to the cathode for the case when $C_{s1}$ is much larger than $C_{s2}$.

Faraday shield 45 also significantly influences the value of the sheath capacitance $C_{s2}$ for the plasma sheath adjacent to the wall 41 of the plasma reactor. If this Faraday shield were not present, then the effective ground for the capacitively coupled rf signal would be provided by the rf induction coil or the environment surrounding the reactor chamber and therefore would be dependent on what other objects were near the reactor. Furthermore, these objects would generally be at a distance that is large enough that the effective ground could be treated as being at infinity. This makes $C_{s2}$ for the side and top walls more on the order of or less than one tenth of $C_{s1}$ instead of ten times $C_{s1}$ as was the case for FIG. 3. The result is that the relationship between the plasma potential $V_p$ and the rf signal is more like that shown in FIG. 7 than like that shown in FIG. 3.

In FIG. 7, it is again assumed that the rf voltage (signal 71) has a peak-to-peak amplitude of 220 volts. For $C_{s1}$ equal to ten times $C_{s2}$, the plasma voltage signal 72 has a peak-to-peak amplitude of 200 volts. The peaks 73 of the plasma voltage $V_p$ again align with the peaks 74 of the rf voltage signal 71 and the spacing between these peaks is again up to several times $kT_e/e$. Likewise, the spacing of the troughs of $V_p$ from ground is on the order of $kT_e/e$ (which is typically a few volts). The plasma voltage signal 72 therefore has a dc component 76 on the order of 100 volts. This contrasts with FIG. 3 where the plasma voltage signal 32 has a dc component on the order of 10 volts plus an offset of order $kT_e/e$.

This greatly increased dc component between the wall and the plasma body results in an unacceptable level of etching or sputtering of the wall by ions in the plasma. Such action not only damages the chamber wall, but also uses up reactant gas and can inject into the plasma contaminants that can interfere with the wafer fabrication processes in the reactor chamber. However, with the Faraday shield 45 closely spaced from wall 41, the effective ground electrode capacitance is increased and $C_{s2}$ is again several times larger than $C_{s1}$ so that the relationship between the rf signal and the plasma voltage $V_p$ is like FIG. 3 instead of like FIG. 7. Indeed, normally, the spacing between the "plates" (i.e., the plasma and the conductive wall) of the capacitance $C_{s2}$ is on the order of 0.1 cm. For the reactor of FIG. 4, when the Faraday shield is closely spaced from wall 41, the capacitance $C_{s2}$ is increased by the thickness of wall 41 divided by the dielectric constant (which is >4), which is equivalent to a vacuum gap of 0.075 cm. Therefore, the wall capacitance $C_{s2}$ is a little more than half of what it would be for a reactor of the type shown in FIG. 1 of comparable dimensions to that in FIG. 4.

Plates 46 are movable radially on the order of or more than 1 cm so that capacitance $C_{s2}$ can be substantially decreased by moving plates 46 away from the walls to vary the ratio $C_{s1}/C_{s2}$ over a range on the order of from 0.1 to 10. These plates are moved close to wall 41 during wafer processing so that etching of the chamber wall and the associated production of contaminants are minimized. In periods other than wafer processing periods, the plates can be moved away from the wall by as much as a cm or more to provide a controlled period of etching of the wall to clean the wall. The remnants of this chamber cleaning step are then drawn out of the reactor before further wafer processing is implemented.

FIGS. 5 and 6 are respectively side cross-sectional and top views of reactor 40 illustrating further optional features of this reactor. Just outside of the top of reactor chamber 50 is a grounded conductive plate 53 that provides for the top of reactor chamber 50 substantially the same function as Faraday shield 45 provides for the sides of this chamber.

On top of the reactor chamber are a set of magnets 54 that alternately orient their North poles downward. A ferromagnetic return plate 55 helps return the flux of the fields produced by the two outermost magnets. The magnets preferably are permanent magnets since this type of magnet economically provides a sufficient magnetic field. This arrangement produces at the top of chamber 50 an array of alternating direction magnetic fields of about 100 Gauss that act like magnetic mirrors to reflect electrons back toward the plasma body. The fields from these magnets penetrate into the reactor chamber a distance on the order of twice the spacing (on the order of 2–3 cm) between these magnets. In other embodiments, this linear array of magnets could be replaced by a set of concentric ring magnets, again having North poles of successive magnets oppositely oriented vertically. In still other embodiments, a flat disc of ferromagnetic material having its North pole oriented vertically or a single ring dc solenoid could be used to produce a single magnetic mirror, which may have a magnetic field as low as several Gauss near the top of the chamber. The embodiment utilizing a magnetic disc is preferred because it is simple, inexpensive and preserves radial symmetry of the reactor. In contrast to this, the lack of radial symmetry of the magnetic fields from the magnets 54 in FIG. 5 will slightly degrade the radial symmetry of wafer etch.

Just outside of the base or top of reactor wall 41 is a conductive coil 56 connected to a dc current source 57 to produce an optional dc magnetic field to further contain electrons away from the side wall. The magnitude of the magnetic field from this coil can be on the order of 1–100 Gauss.

The plasma reactor of FIGS. 4–6 provides significantly improved operation compared to many other existing reactors. Whereas the plasma reactor (discussed in the Background of the Invention) that utilizes a microwave source produces only a few milliamps/cm$^2$ current density, this reactor could produce up to 50–100 milliamps/cm$^2$. Tests show that this high current results for a variety of reactant gases, such as $SF_6$, $CF_2Cl_2$, $O_2$ and argon. This indicates that relatively more of the power is going into the production of ions instead of into the production of neutral fragments as in other plasma production methods at pressures above 1 mTorr. These neutral fragments would not contribute to this current. This is important because only the ions are given the perpendicular direction of impact on the wafer that results in the formation of substantially vertical walls. The ability to produce a very low sheath voltage at the wafer means that a 4,000 Å thick gate of polysilicon can be etched vertically without damage to or etching of an underlying 100 Å thick $SiO_2$ gate insulator by reducing the sheath voltage to less than 20–30 volts.

Reactor 40 includes a gas source 49 and an exhaust port 58 that is part of an exhaust system 59 that includes a pump to exhaust plasma process products and to keep the pressure to a selected level. Typically, the pressure is held at on the order of 1–30 milliTorr pressure to enhance diffusion of electrons from the electron heating region near the side wall into the bulk volume. Even at this pressure, the inductively coupled power is primarily coupled into production of ions. In contrast to this, other plasma systems such as the microwave plasma systems produce relatively more free radicals at pressures above approximately 1 milliTorr. If a microwave plasma reactor is to primarily produce ions, then the pressure needs to be on the order of or less than a few tenths of a milliTorr. This requires that reactor pumps have speeds greater than a few Torr-liters per second. This large rate of pumping requires either the use of cryogenic pumps closely coupled to the reactor chamber or very large turbo pumps with large ports to the chamber. In contrast, the reactor disclosed herein can operate at higher pressures and requires a pump speed only on the order of a few hundred milliTorr-liters per second. This is easily achieved with smaller pumps which need not clutter the space around the chamber and interfere with wafer handling or other essential chamber peripherals. Such pumps also would not require regeneration or pose a safety hazzard as do cryogenic pumps.

I claim:

1. A plasma reactor for processing a semiconductor substrate comprising:

a reactor chamber within which a plasma is generated to produce at least one plasma product for processing the semiconductor substrate;

a gas source coupled to the reactor chamber to provide gas into the reactor chamber;

an exhaust system coupled to the reactor chamber to exhaust gas from the reactor chamber;

a first source of radio frequency power;

an induction coil adjacent to the reactor chamber and coupled to said first source of radio frequency power to inductively couple power into the plasma from said first source of radio frequency power;

a split Faraday shield between the induction coil and the plasma, the split Faraday shield forming at least one substantially nonconductive gap such that the induction coil inductively couples power from said first radio frequency power source through the split Faraday shield to sustain the plasma; and a support for the semiconductor substrate positioned such that the semiconductor substrate is exposed to said at least one plasma product during processing.

2. The plasma reactor of claim 1 wherein the split Faraday shield has plates that are movable to vary the capacitance between the plasma in the reactor chamber and said split Faraday shield.

3. The plasma reactor of claim 1 wherein:

the reactor chamber has a nonconductive reactor wall; and the split Faraday shield comprises a plurality of conductive plates adjacent to said reactor wall, each plate being spaced from a neighboring plate by a gap that is smaller than the distance between said induction coil and the reactor wall.

4. A plasma reactor as in claim 1, wherein said support comprises an electrode adjacent to which the semiconductor substrate is placed for processing, further comprising a second source of radio frequency power coupled to said electrode.

5. A plasma reactor as in claim 4 wherein:

said induction coil produces within the reactor chamber a magnetic field that is substantially perpendicular to said electrode, whereby, an electric field induced by time variation of the signal to said induction coil is substantially parallel to said electrode so that the induced electric field does not directly affect the potentials of the plasma and the electrode.

6. A plasma reactor as in claim 4 wherein much less radio frequency power is provided to the electrode than to the induction coil, whereby the plasma produced in said reactor chamber has an ion density that is substantially determined by the power to said induction coil.

7. A plasma reactor as in claim 6 wherein the power signal to the electrode has a peak-to-peak voltage amplitude less than 200 volts peak-to-peak, whereby this reactor is suitable for a soft etch of the semiconductor substrate.

8. A plasma reactor as in claim 2 further comprising an electrode, adjacent to which the semiconductor substrate is to be placed for processing; and a second source of radio frequency power coupled to said electrode;

wherein said plates are movable over a distance such that a ratio $C_{s1}/C_{s2}$ can be varied over a range that includes the value 1, where $C_{s2}$ is the sheath capacitance between the plasma and the split Faraday shield and where $C_{s1}$ is the sheath capacitance between the plasma and the electrode.

9. A plasma reactor as in claim 1 wherein the inductively coupled power is at a frequency $f_1$ in the range from 0.1–6 MHz.

10. A plasma reactor as in claim 4 wherein the power that is inductively coupled from the first source of radio frequency power is at a frequency $f_1$ and the power that is coupled from the second source of radio frequency power is at a frequency $f_h$ that is larger than $f_1$ and that is at least twice as large as the inverse of an average transit time for an ion to cross a plasma sheath at said electrode.

11. A plasma reactor as in claim 4 wherein the power that is coupled from the second source of radio frequency power is at a frequency $f_h$ that is selected from the set consisting of 13.56 MHz, 27.12 MHz and 40.68 MHz.

12. A plasma reactor as in claim 1 wherein the exhaust system and the gas source cooperatively produce within said chamber a pressure for which ions are produced in said plasma at a rate at least on the order of that at which free radicals are produced.

13. A plasma reactor as in claim 1 further comprising:

a grounded conductive plate adjacent to a top portion of the reactor chamber.

14. A plasma reactor as in claim 1 further comprising:

a reactor wall enclosing said reactor chamber; and means for producing a dc magnetic field adjacent to a top portion of the reactor wall, thereby helping constrain energetic electrons away from the top portion of the reactor wall.

15. A plasma reactor as in claim 14 wherein said means for producing a dc magnetic field adjacent to a top portion of the reactor wall comprises a plurality of permanent bar magnets arranged parallel to one another and to the top portion of the reactor wall, each magnet having its North pole oppositely directed from any nearest neighbor magnets.

16. A plasma reactor as in claim 15 further comprising:

a ferromagnetic return plate which at least covers the magnets on top and provides a ferromagnetic return for magnetic field lines at the outer edges of the plurality of bar magnets.

17. A plasma reactor as in claim 14 wherein said means for producing a dc magnetic field adjacent to a top portion of the reactor wall comprises:

a plurality of concentric annular magnets parallel to the top portion of the reactor wall, each magnet having its North pole oriented substantially perpendicular to the top portion of the reactor wall and oppositely directed from any nearest neighbor magnets; and a ferromagnetic return plate which at least covers the magnets on top and provides a ferromagnetic return for magnetic field lines at the outer edges of the plurality of annular magnets.

18. A plasma reactor as in claim 14 wherein said means for producing a dc magnetic field adjacent to a top portion of the reactor wall comprises a disk magnet having it North pole oriented substantially perpendicular to the top portion of the reactor wall.

19. A plasma reactor as in claim 14 wherein said means for producing a dc magnetic field adjacent to a top portion of the reactor wall comprises a dc electromagnetic producing a magnetic field having its North pole oriented substantially perpendicular to the top portion of the reactor wall.

20. A plasma reactor as in claim 4 further comprising:

a dc power source; and a coil encircling the reactor chamber and connected to the dc power source to produce a dc magnetic field that is substantially perpendicular to said electrode.

21. A method of processing a semiconductor substrate in a plasma reactor comprising the steps of:

supplying gas to a reaction chamber;

shielding the gas in the reaction chamber with a split Faraday shield, the split Faraday shield forming at least one substantially nonconductive gap to allow the passage of inductively coupled power into the gas in the reaction chamber;

inductively coupling power into the gas through said split Faraday shield to sustain a plasma in the reaction chamber;

forming at least one plasma product for processing the semiconductor substrate; and exposing the semiconductor substrate to said at least one plasma product for processing.

22. A method as in claim 21, further comprising the step of:

adjusting the spacing of the split Faraday shield from the plasma.

23. A method as in claim 21, further comprising the step of:

magnetically reflecting electrons within the reaction chamber away from a top of the reaction chamber.

24. A method as in claim 21 further comprising the step of:

capacitively coupling power into the reaction chamber.

25. A method of processing a wafer in a plasma reactor, said method comprising the steps of:

supplying gas to a reaction chamber enclosed by nonconductive walls;

exhausting gas from the reaction chamber;

inductively coupling power into the reaction chamber;

capacitively coupling power into the reaction chamber via an electrode having a capacitance $C_{electrode}$ to a plasma within the reaction chamber;

shielding the reactor with a split Faraday shield that encircles the reaction chamber and that produces a capacitance $C_{wall}$ between the plasma and the combination of the split Faraday shield and the nonconductive wall; and adjusting the spacing of the split Faraday shield from the nonconductive wall over a range that produces a ratio $C_{electrode}/C_{wall}$ that varies over a range that includes the value 1.

26. A method as in claim 24 wherein the inductively coupled power is provided at a frequency in the range 0.1–6 MHz and the capacitively coupled power is provided at a frequency selected from the set consisting of 13.56 MHz, 27.12 MHz and 40.68 MHz.

27. A method as in claim 21 further comprising the step of:

producing a dc magnetic field within the reaction chamber in a direction substantially perpendicular to an electrode utilized to capacitively couple power into said reaction chamber.

28. A method as in claim 21 further comprising the step of exhausting gas from the reaction chamber, wherein said steps of supplying gas and exhausting gas produce within said reaction chamber a pressure in the range from 1–30 milliTorr.

29. The plasma reactor of claim 1 wherein said reactor has a height and a cylindrical lateral cross-section having a diameter that is greater than said height.

30. The plasma reactor of claim 1 wherein said split Faraday shield comprises plates that are moveable to vary the capacitance between the plasma and said split Faraday shield.

31. The plasma reactor of claim 1 wherein said split Faraday shield comprises a plurality of conductive plates of substantially equal size disposed externally about said plasma, each plate being spaced from a neighboring plate by a gap.

32. The plasma reactor of claim 1 wherein the induction coil encircles the reactor chamber.

33. The plasma reactor of claim 1, further comprising a nonconductive reactor wall enclosing the reactor chamber wherein the split Faraday shield and the induction coil are external to said nonconductive reactor wall.

34. The plasma reactor of claim 1, wherein the induction coil produces a magnetic field having a direction and the gap formed by said split Faraday shield is substantially parallel to the direction of the magnetic field such that the gap substantially prevents the inducement of a current in the split Faraday shield by said magnetic field.

35. A plasma reactor as in claim 1 wherein the plasma in the reactor chamber has a pressure of greater than 1 milliTorr.

36. A plasma reactor as in claim 4, wherein:

said split Faraday shield acts as a counter electrode to said electrode.

37. A plasma reactor as in claim 36, wherein:

said Faraday shield is grounded relative to said electrode.

38. A plasma reactor as in claim 36, wherein:

said Faraday shield and said electrode each have an area, and the area of the Faraday shield is substantially larger than the area of the electrode.

39. The plasma reactor of claim 1, wherein said split Faraday shield is grounded relative to said induction coil.

40. The plasma reactor of claim 1, wherein said split Faraday shield is direct current grounded relative to said induction coil.

41. The plasma reactor of claim 1, wherein said split Faraday shield is radio frequency grounded relative to said induction coil.

42. A plasma reactor as in claim 1, wherein:

the induction coil produces within the reactor chamber a magnetic field that is substantially perpendicular to the support, whereby an electric field induced by the time variation of the signal to the induction coil is substantially parallel to the support so that the induced electric field does not substantially affect the potentials of the plasma and the support.

43. The plasma reactor of claim 1, wherein the workpiece is a semiconductor wafer.

44. The plasma reactor of claim 4, wherein the workpiece is a semiconductor wafer.

45. The plasma reactor of claim 1, wherein the at least one plasma product is selected from the group consisting of ions, free electrons, neutral radicals, and excited molecules.

46. The plasma reactor of claim 1, wherein the plasma has a potential modulation on the order of 20 volts peak-to-peak.

47. The plasma reactor of claim 1, wherein the plasma has a potential modulation no greater than 20 volts peak-to-peak.

48. The plasma reactor of claim 1, wherein the at least one nonconductive gap has a width on the order of 1 cm.

49. A plasma reactor for processing a semiconductor substrate comprising:

a reactor chamber within which a plasma is generated to produce at least one plasma product for processing the semiconductor substrate;

a first source of radio frequency power;

an induction coil adjacent to the reactor chamber and coupled to the first source of radio frequency power to inductively couple power into the plasma from the first source of radio frequency power;

a split Faraday shield between the induction coil and the plasma, the split Faraday shield forming a plurality of substantially nonconductive gaps such that the induction coil couples power from the first source of radio frequency power through the split Faraday shield to sustain the plasma in the reactor chamber; and a support for the semiconductor substrate positioned such that the semiconductor substrate is exposed to the at least one plasma product during processing.

50. The plasma reactor of claim 49, wherein the plurality of gaps are arranged substantially symmetrically about the reactor chamber.

51. The plasma reactor of claim 49, wherein the split Faraday shield forms at least four substantially nonconductive gaps such that the induction coil couples power from the first source of radio frequency power into the reactor chamber.

52. The plasma reactor of claim 49, wherein the area of the split Faraday shield and a distance between the split Faraday shield and the plasma are selected such that the capacitive impedance between the plasma and the split Faraday shield is less than the capacitive impedance between the plasma and any source of radio frequency power.

53. The plasma reactor of claim 49, further comprising at least one source of capacitively coupled radio frequency power;

wherein the area of the split Faraday shield and a distance between the split Faraday shield and the plasma are selected such that the capacitive impedance between the plasma and the split Faraday shield is less than the capacitive impedance between the plasma and the at least one source of capacitively coupled radio frequency power.

54. The plasma reactor of claim 53, wherein the capacitive impedance between the plasma and the split Faraday shield is several times less than the capacitive impedance between the plasma and the at least one source of capacitively coupled radio frequency power.

55. The plasma reactor of claim 54, wherein:

the at least one source of capacitively coupled power is a second source of radio frequency power coupled to the support;

the at least one plasma product is ions; and the source of capacitively coupled radio frequency power accelerates the ions toward the semiconductor substrate during processing.

56. The plasma reactor of claim 49, further comprising a source of capacitively coupled power for said plasma, wherein:

the source of capacitively coupled power acts as an effective cathode relative to the plasma;

the split Faraday shield acts as an effective anode relative to the plasma; and the area of the effective anode is much greater than the area of the effective cathode such that the ratio $C_{s2}/C_{s1}$ is at least 10, where $C_{s2}$ is the capacitance between the plasma and the effective anode and $C_{s1}$ is the capacitance between the plasma and the effective cathode.

57. The plasma reactor of claim 49, wherein the semiconductor substrate is susceptible to damage from bombardment of ions from the plasma, and wherein the split Faraday shield reduces the damage to the semiconductor substrate from the bombardment of the ions relative to a level of damage that would exist in the absence of the split Faraday shield.

58. The plasma reactor of claim 49, wherein the semiconductor substrate is susceptible to damage from bombardment of high energy ions having impact energy of at least 100 electron volts and wherein the split Faraday shield substantially reduces the bombardment of the semiconductor substrate by the high energy ions relative to a level of bombardment that would exist in the absence of the split Faraday shield.

59. The plasma reactor of claim 1, wherein the split Faraday shield substantially eliminates bombardment of the semiconductor substrate by high energy ions having an impact energy of at least 100 electron volts.

60. The plasma reactor of claim 49, wherein an average direct current potential of the plasma is no greater than 30 volts relative to the semiconductor substrate.

61. The plasma reactor of claim 49, wherein the plasma has a potential modulation no greater than 20 volts peak-to-peak.

62. The plasma reactor of claim 49, wherein the plasma has a potential no greater than 20 volts plus an offset on the order of $kT_e/e$ relative to ground.

63. The plasma reactor of claim 49, wherein the plasma has an average direct current potential no greater than 10 volts plus an offset on the order of $kT_e/e$ relative to ground.

64. The plasma reactor of claim 49, wherein the plasma has a potential modulation on the order of 20 volts peak-to-peak.

65. The plasma reactor of claim 49, wherein the induction coil has a first end and a second end coupled to the first source of radio frequency power; and wherein the first source of radio frequency power drives current through the induction coil between the first end and the second end such that the induction coil non-resonantly couples power from the first source of radio frequency power into the reactor chamber.

66. The plasma reactor of claim 49, wherein the induction coil produces a magnetic field having a direction and the gaps formed by the split Faraday shield are substantially parallel to the direction of the magnetic field such that the gaps substantially prevent the inducement of a circumferential current in the split Faraday shield by the magnetic field that would prevent the inductive coupling of power into the reactor chamber.

67. The plasma reactor of claim 49, wherein the induction coil produces within the reactor chamber a magnetic field that is substantially perpendicular to the support, whereby, an electric field induced by the time variation of the signal to the induction coil is substantially parallel to the support so that the induced electric field does not substantially affect the potentials of the plasma and the support.

68. The plasma reactor of claim 49, wherein:

the reactor chamber has a radius;

the first source of radio frequency power has a frequency and a power; and the radius of the reactor chamber, and the frequency and the power of the first source of radio frequency power are selected to produce an electric field within the reactor chamber having a peak-to-peak amplitude on the order of 10 volts/cm.

69. The plasma reactor of claim 49, wherein:

the reactor chamber has a radius;

the first source of radio frequency power has a frequency and a power; and the radius of the reactor chamber, and the frequency and the power of the first source of radio frequency power are selected to produce an electric field within the reactor chamber having a peak-to-peak amplitude in the range of from 1 to 10 volts/cm.

70. The plasma reactor of claim 49, wherein the split Faraday shield is grounded.

71. The plasma reactor of claim 49, wherein the split Faraday shield is radio frequency grounded relative to the induction coil.

72. The plasma reactor of claim 49, further comprising a nonconductive reactor wall enclosing the reactor chamber wherein the split Faraday shield and the induction coil are external to the nonconductive reactor wall.

73. The plasma reactor of claim 49, wherein the support comprises an electrode adjacent to which the semiconductor substrate is placed for processing, further comprising a second source of radio frequency power coupled to the electrode.

74. The plasma reactor of claim 73, wherein said at least one plasma product is ions and the electrode accelerates the ions toward the semiconductor substrate during processing.

75. The plasma reactor of claim 49, further comprising a reactor wall enclosing the reactor chamber wherein the width of each of the gaps is smaller than the distance between the induction coil and the reactor wall.

76. The plasma reactor of claim 49, wherein each of the substantially nonconductive gaps has a width on the order of 1 cm.

77. The plasma reactor of claim 49, wherein each of the substantially nonconductive gaps has a width no greater than 1 cm.

78. The plasma reactor of claim 49, wherein the plasma is maintained at a pressure greater than 1 milliTorr during processing.

79. The plasma reactor of claim 65, wherein the induction coil produces a magnetic field having a direction and the gaps formed by the split Faraday shield are substantially parallel to the direction of the magnetic field such that the gaps substantially prevent the inducement of a circumferential current in the split Faraday shield by the magnetic field that would prevent the inductive coupling of power into the reactor chamber; and wherein the magnetic field is substantially perpendicular to the support, whereby, an electric field induced by the time variation of the signal to the induction coil is substantially parallel to the support so that the induced electric field does not substantially affect the potentials of the plasma and the support.

80. The plasma reactor of claim 79, further comprising a nonconductive reactor wall enclosing the reactor chamber, wherein:

the split Faraday shield and the induction coil are external to the nonconductive reactor wall;

the semiconductor substrate is susceptible to damage from bombardment of ions from the plasma, and wherein the split Faraday shield reduces the damage to the semiconductor substrate from the bombardment of the ions relative to a level of damage that would exist in the absence of the split Faraday shield; and the width of each of the gaps is smaller than the distance between the induction coil and the nonconductive reactor wall.

81. The plasma reactor of claim 60, further comprising a reactor wall enclosing the reactor chamber wherein the width of each of the gaps is smaller than the distance between the induction coil and the reactor wall.

82. The plasma reactor of claim 60, wherein the area of the split Faraday shield and a distance between the split Faraday shield and the plasma are selected such that the capacitive impedance between the plasma and the split Faraday shield is less than the capacitive impedance between the plasma and any source of radio frequency power.

83. The plasma reactor of claim 60, further comprising at least one source of capacitively coupled radio frequency power;

wherein the area of the split Faraday shield and a distance between the split Faraday shield and the plasma are selected such that the capacitive impedance between the plasma and the split Faraday shield is at least ten times less than the capacitive impedance between the plasma and the at least one source of capacitively coupled radio frequency power.

84. The plasma reactor of claim 83, wherein the induction coil has a first end and a second end coupled to the first source of radio frequency power; and wherein the first source of radio frequency power drives current through the induction coil between the first end and the second end such that the induction coil non-resonantly couples power from the first source of radio frequency power into the reactor chamber.

85. The plasma reactor of claim 84, further comprising a nonconductive reactor wall enclosing the reactor chamber wherein the split Faraday shield and the induction coil are external to the nonconductive reactor wall and wherein:

the split Faraday shield is grounded; and the semiconductor substrate is susceptible to damage from bombardment of ions from the plasma, and wherein the split Faraday shield reduces the damage to the semiconductor substrate from bombardment of the ions relative to a level of damage that would exist in the absence of the split Faraday shield.

86. The plasma reactor of claim 85, wherein the width of each of the gaps is smaller than the distance between the induction coil and the nonconductive reactor wall.

87. The plasma reactor of claim 85, wherein the support comprises an electrode adjacent to which the semiconductor substrate is placed for processing, further comprising a second source of radio frequency power coupled to the electrode.

88. A plasma reactor for processing a semiconductor wafer comprising:

a nonconductive reactor wall enclosing a reactor chamber within which a plasma is generated to produce at least one plasma product for processing said semiconductor wafer;

power means for providing capacitive and inductive power;

shield means external to the reactor chamber for substantially blocking the capacitive power from the power means from reaching the reactor chamber while permitting the inductive power from the power means to reach the reactor chamber;

means for exposing the semiconductor wafer to the at least one plasma product during processing.

89. The plasma reactor of claim 88, further comprising means for accelerating charged particles toward the semiconductor wafer.

90. The plasma reactor of claim 88, further comprising means for varying the capacitance between said shield means and the plasma.

91. The method of claim 21, wherein the workpiece is a semiconductor wafer.

92. The method of claim 21, further comprising the step of maintaining an average direct current potential of the plasma at no greater than 30 volts relative to the semiconductor substrate.

93. The method of claim 21, further comprising the step of:

maintaining the potential of the plasma such that a modulation of the plasma potential is no greater than 20 volts peak-to-peak.

94. The method of claim 21, further comprising the step of maintaining the potential of the plasma at no greater than 20 volts plus an offset on the order of $kT_e/e$ relative to ground.

95. The method of claim 21, further comprising the steps of:

capacitively coupling power into the plasma through a capacitance $C_{s1}$; and capacitively coupling power from the plasma to ground through a capacitance $C_{s2}$ between the plasma and the split Faraday shield;

wherein the capacitance $C_{s1}$ is less than the capacitance $C_{s2}$.

96. The method of claim 95, wherein the capacitance $C_{s1}$ is at least ten times less than the capacitance $C_{s2}$.

97. The method of claim 21, wherein the step of forming the at least one plasma product further comprises the step of:

using the inductively coupled power to produce an electric field within the reaction chamber having a peak-to-peak amplitude on the order of 10 volts/cm.

98. The method of claim 21, wherein the step of forming the at least one plasma product further comprises the step of:

using the inductively coupled power to produce an electric field within the reaction chamber that is substantially parallel to the workpiece.

99. The method of claim 21, wherein the inductively coupled power is coupled non-resonantly into the reactor chamber.

100. The method of claim 21, wherein the semiconductor substrate is susceptible to damage from bombardment of ions, further comprising the step of:

using the split Faraday shield to block sufficient capacitive power such that the damage to the semiconductor substrate from bombardment of the ions is reduced relative to a level of damage that would exist in the absence of the split Faraday shield.

101. The method of claim 24, wherein the capacitively coupled power causes ions to accelerate toward the semiconductor substrate.

102. The method of claim 21, further comprising the step of varying the capacitance between the split Faraday shield and the plasma.

103. The method of claim 21, further comprising the step of varying the capacitance between the split Faraday shield and the plasma relative to the capacitance between the semiconductor substrate and the plasma.

104. A plasma reactor comprising:

a reactor chamber within which a plasma is generated;

means for coupling said reactor chamber to a gas source to provide gas to the reactor chamber;

means for coupling said reactor chamber to an exhaust system to exhaust gas from the reactor chamber;

a first source of radio frequency power;

an induction coil surrounding at least part of the plasma and coupled to said first source of radio frequency power to inductively couple power into the plasma from said first radio frequency power source;

an electrode, adjacent to which a wafer is to be placed for processing;

a second source of radio frequency power coupled to said electrode; and a counter electrode to said electrode, said counter electrode being external to the reactor chamber;

wherein said counter electrode is movable to vary the capacitance between the plasma and the counter electrode.

105. The plasma reactor of claim 1, wherein said split Faraday shield comprises at least four radio frequency grounded conductive plates disposed externally about said plasma.

106. The plasma reactor of claim 1, wherein said split Faraday shield comprises a plurality of conductive shield sections that are each radio frequency grounded.

107. The plasma reactor of claim 70, wherein said split Faraday shield comprises a plurality of conductive shield sections that are each radio frequency grounded.

108. The plasma reactor of claim 1, wherein the reactor chamber has a nonconductive wall and said split Faraday shield is much closer to the nonconductive wall than to the induction coil during processing of the semiconductor substrate.

109. The plasma reactor of claim 4, wherein the reactor chamber has a nonconductive wall and said split Faraday shield is much closer to the nonconductive wall than to the induction coil during processing of the semiconductor substrate.

110. The plasma reactor of claim 1, wherein:

the semiconductor substrate comprises a semiconductor wafer having a surface with a layer of polysilicon over a thin underlying layer of oxide insulator;

the induction coil couples sufficient power into the plasma to produce a high ion density in the plasma; and the split Faraday shield substantially reduces the level of capacitive modulation of the plasma potential relative to a level of capacitive modulation that would be present in the absence of the split Faraday shield such that ions from the plasma controllably etch the polysilicon at a high rate without substantially damaging the thin underlying layer of oxide insulator.

111. The plasma reactor of claim 4, wherein:

the semiconductor substrate comprises a semiconductor wafer having a surface with a layer of polysilicon over a thin underlying layer of oxide insulator;

the induction coil couples sufficient power into the plasma to produce a high ion density in the plasma; and the split Faraday shield substantially reduces the level of capacitive modulation of the plasma potential relative to a level of capacitive modulation that would be present in the absence of the split Faraday shield such that the second source of radio frequency power controllably accelerates ions from the plasma to etch the polysilicon at a high rate without substantially damaging the thin underlying layer of oxide insulator.

112. The plasma reactor of claim 111, wherein the ion current density at the semiconductor wafer is greater than a few milliamps/cm$^2$.

113. The method of claim 21 wherein:

the semiconductor substrate includes a surface layer of polysilicon and a thin underlying layer of oxide insulator;

the step of exposing the semiconductor substrate to said at least one plasma product further comprises the step of etching the surface layer of polysilicon using the at least one plasma product; and the step of shielding the gas further comprises the step of controlling the energy of the at least one plasma product such that the surface layer of polysilicon is etched without substantially damaging the thin underlying layer of oxide insulator.

114. A plasma reactor comprising:

a reactor chamber within which a plasma is generated;

means for coupling said reactor chamber to a gas source to provide gas to the reactor chamber;

means for coupling said reactor chamber to an exhaust system to exhaust gas from the reactor chamber;

a first source of radio frequency power;

an induction coil surrounding at least part of the plasma and coupled to said first source of radio frequency power to inductively couple power into the plasma from said first radio frequency power source;

an electrode, adjacent to which a wafer is to be placed for processing;

a second source of radio frequency power coupled to said electrode; and a counter electrode to said electrode, said counter electrode being external to the reactor chamber;

wherein the relative areas of the electrode and the counter electrode, and a distance between the counter electrode and the plasma are selected such that the ratio $C_{s2}/C_{s1}$ is at least 10, where $C_{s2}$ is the sheath capacitance between a plasma body and the counter electrode and $C_{s1}$ is the sheath capacitance between the plasma body and the electrode.

* * * * *